United States Patent [19]
Bergt
[11] 3,760,240
[45] Sept. 18, 1973

[54] LIGHT-SENSITIVE SEMICONDUCTOR DEVICE

[75] Inventor: Hans-Eberhard Bergt, Munchen, Germany

[73] Assignee: Siemens Aktiengesellschaft, Berlin & Munchen, Germany

[22] Filed: Oct. 6, 1971

[21] Appl. No.: 186,969

[30] Foreign Application Priority Data
Oct. 8, 1970 Germany.................. P 20 49 507.2

[52] U.S. Cl.... 317/235 R, 317/235 N, 317/235 AC
[51] Int. Cl. .............................................. H01l 5/00
[58] Field of Search......................... 317/235, 27, 42

[56] References Cited
UNITED STATES PATENTS
3,649,889 3/1972 Hart.................................... 317/235
OTHER PUBLICATIONS
Japan. Jour. Applied Physics Vol. 6, (1967), pp. 905–906 $SnO_2$-Si Heterojunctions.

*Primary Examiner*—John W. Huckert
*Assistant Examiner*—E. Wojciechowicz
*Attorney*—Arthur E. Wilfond et al.

[57] ABSTRACT

Light sensitive semiconductor device with several light sensitive elements, mutually separated from each other, arranged in the form of a matrix in rows and columns on a doped semiconductor substrate. Each of the light sensitive elements has a rectifying hetero junction, which is formed by a thin, light transparent semiconductor layer made as an antireflex layer, and a first semiconductor region diffused into the semiconductor substrate or a second partial region diffused into the first semiconductor region. The thin light transparent semiconductor layer extends in rows on the semiconductor substrate isolated from the latter by an isolating layer. The diffused first semiconductor region extends in columns, into the surface of the semiconductor substrate. The light sensitive semiconductor layers, extending in the rows, and the diffused first semiconductor regions, extending in columns, are provided with barrier free contacts at the edges.

8 Claims, 2 Drawing Figures

LIGHT-SENSITIVE SEMICONDUCTOR DEVICE

Figure 1:
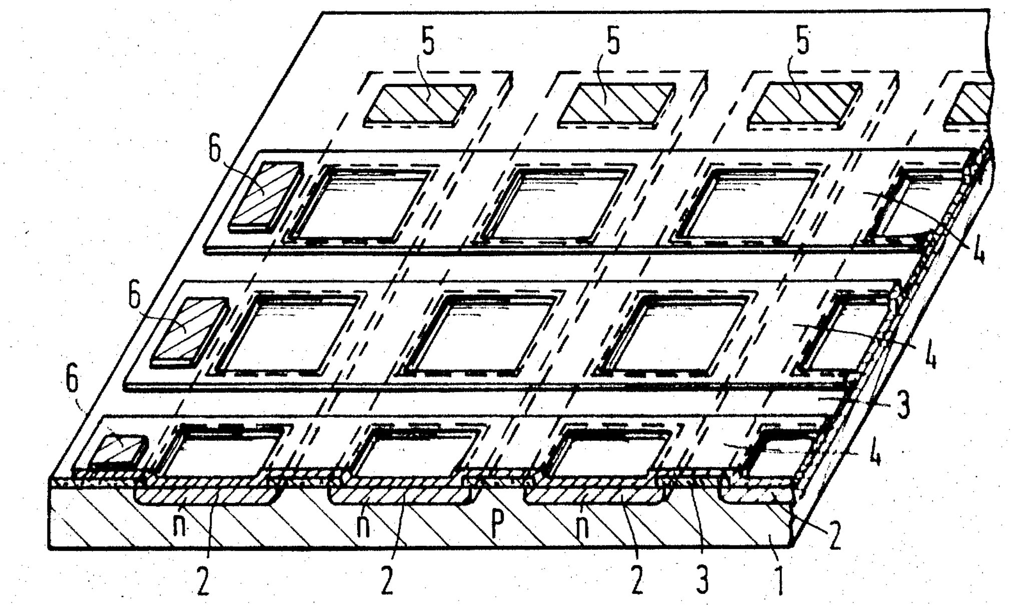

The present invention relates to a light sensitive semiconductor device with several light sensitive elements, separated from each other, arranged in the form of a matrix in rows and columns on a doped semiconductor substrate.

Matrix arrangements or mosaics of photosensitive elements, for instance double diffused mosaics, used for the electronic generation of images, are already known. Arrangements of semiconductor elements provide for a greater packing density of the light sensitive elements and, therefore, better resolution than known arrangements using, for instance, vacuum photo cells. Up to now, photo diodes, thyristors or double diffused bipolar photo transistors, for instance, have been used as elements in semiconductor mosaics.

However, the resolution, which is attained with the known light sensitive semiconductor arrangements, is limited because of the metallic conductor path used to provide the contacts. In order to improve the resolution in known arrangements, the individual elements have been smaller. However, the metal conductor path cannot be reduced to the same extent and this results in a reduction of the sensitivity of the arrangement.

In many applications such as color recogniation, pickup of electronic television images, etc. the infrared sensitivity is detrimental. Thus, for instance, the spectral photo sensitivity of the photo electric converter in the generation of television images should approximately correspond to the sensitivity of the eye. In order to achieve this, it is necessary, in the known arrangements, to suppress the infrared component of the radiation by additional filters.

It is an object of the present invention to provide a light sensitive semiconductor device with improved photoelectric properties in which the disadvantages discussed above are avoided.

In a light sensitive semiconductor device with several light sensitive elements, separated from each other, which are arranged in the form of a matrix in rows and columns on a doped semiconductor substrate, the above difficulties are resolved by providing each light sensitive semiconductor element with a rectifying hetero junction which is formed by a thin, light transparent semiconductor layer constituing an anti-reflection layer and of a first semiconductor region diffused into the semiconductor substrate or a second partial region diffused into the first semiconductor region, that the thin, light transparent or permeable semiconductor layer extends in rows on the semiconductor substrate, electrically isolated by an isolation layer from the latter. The first diffused semiconductor layer extends in columns in the surface of the semiconductor substrate. The light sensitive semiconductor layers extending in rows and the diffused first semiconductor regions extending in columns are provided with barrier free contacts at the edges.

For the fabrication of the rectifying hetero junctions, which improve the photoelectric properties of the individual light sensitive elements of the device according to the invention, there are diffused into a doped semiconductor substrate, consisting preferably of silicon, germanium, or gallium arsenide, oppositely doped first regions or second partial regions into these first regions. On the first regions or the second regions diffused into the first regions in the form of islands, there are applied in rows, with mutual spacing, thin highly light permeable and electrically highly conductive semiconductor layers which are isolated, for instance, by a silicon dioxide layer. These light permeable layers form hetero junctions with the semiconductor material of the diffused first regions or, respectively, the second partial regions, at the points where the thin, light transparent layers intersect with the diffused-in regions and at which windows are provided in the insulating layers. The thin, light transparent layers, preferably, consist of one of the following semiconductor materials: tin oxide ($SnO_2$), antimony-doped $SnO_2$, indium oxide ($In_2O_3$) or $In_2O_3$ doped with tin, titanium or cadmium. The light transparent layers arranged with spacing in rows are thin, highly light permeable and electrically highly conductive semiconductor layers formed with the semiconductor material of the first regions diffused into the semiconductor substrate or the second partial regions, respectively, rectifying hetero junctions in the windows in the isolating layers at the intersection points and exhibit an optical index of refraction of such magnitude, as well as such an optical layer thickness, that they simultaneously serve as anti-reflection layers.

The semiconductor regions diffused-in by columns exhibit the opposite conduction type from the doped semiconductor substrate and they possibly provide second diffused-in partial regions form, in the first semiconductor regions, islands of the same conduction type as the doped semiconductor substrate.

Figure 2:
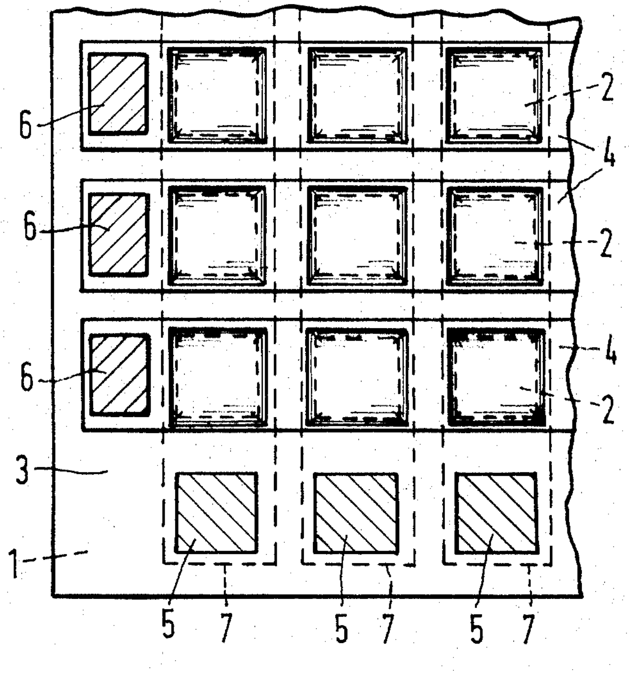

Although the invention is illustrated and described herein, it is nevertheless not intended to be limited to the details shown, since various modifications may be made therein within the scope and the range of the claims. The invention, however, together with additional objects and advantages will be best understood, from the following description and in connection with the accompanying drawing, in which:

FIGS. 1 and 2 describe a perspective and plan view, respectively, of two embodiments.

The illustration embodiments show light sensitive semiconductor devices, the individual light sensitive elements of which have a hetero junction of silicon tin oxide.

FIG. 1 shows, in perspective, a light sensitive semiconductor device, according to the invention, with a multiplicity of light sensitive semiconductor elements arranged in rows and columns. The light sensitive elements constituting photo diodes having a hetero junction transition.

In the light sensitive semiconductor device, according to the invention, a doped semiconductor substrate 1, consists for example of p-doped silicon. Regions 2 with opposite doping which in this example, therefore, are of the n- conductivity type, are diffused into this semiconductor substrate 1 in columns, spaced from each other. An $SiO_2$ layer, thin, light transparent semiconductor layer 4, which in this example, consist of tin oxide are on the semiconductor substrate 1, which is provided with diffused regions 2 run in rows, spaced from each other and insulated electrically against the semiconductor substrate 1 by an isolation layer 3. At the points where tin layers intersect with the diffused in regions 2, a hetero junction is seen in the windows provided in the insulating layer 3. These light transparent layers 4, applied in rows, constitute a hetero junction while simultaneously serving as contacts. Evaporation of additional aluminum conductor paths can, therefore, be dispensed with. This is a great advantage in the manufacture of the desired high resolution mosaic with great packing density. The contacts by columns of the semiconductor device, according to the invention, takes place via the diffused-in regions 2. The regions 2 diffused by columns are provided at the edges with barrier free contacts 5. The thin, light transparent layers 4, which run in rows, are provided at the edge with barrier free contacts 6.

FIG. 2 shows, in plan view, another light sensitive semiconductor device according to the invention. The light sensitive semiconductor elements, arranged in rows and columns, constitute in this example bi-polar photo transistors.

The light sensitive semiconductor device, according to the invention, consists of a doped semiconductor substrate 1, in this example of doped silicon substrate, into which diffused in columns and spaced from each other are oppositely doped first regions 7. Into these regions 7 are diffused oppositely doped second partial regions 2, which form hetero junctions with thin, light permeable layers 4, in this example $SnO_2$ layers, which extend in rows, spaced from each other, on the semiconductor substrate 1, at the points where they intersect with the latter and at which windows an isolation layer 3 is provided. These partial regions 2 are isolated, in addition to the intersection points, at which windows in the isolation layer 3 are provided against the semiconductor substrate 1 by isolation layer 3, in this case a silicon dioxide layer, and exhibit the same type of conduction as the doped semiconductor substrate 1. The thin, light permeable layers 4, which run in rows on the semiconductor substrate 1, are provided at the edge with the barrier free contacts 6, and the diffused in first regions 7 which run in columns on the surface of the semiconductor substrate 1 are provided at the edge with the barrier free contacts 5. For the sake of greater clarity, the barrier free contacts 5, 6 are shown shaded in FIG. 2.

The thin layers 4 which, in this embodiment example, consist of tin oxide, again have two functions. Firstly, they act as a collector at the oxide layer windows provided at the intersection points and, secondly, these collectors are connected by the layers 4 row by row. The evaporation of additional metal conductor paths can therefore be dispensed with, i.e. the light sensitivity of these mosaics according to the invention, is greater than in known mosaics. Furthermore, the danger of short circuit at holes in the silicon dioxide layer is less with tin oxide conductor paths. If a hole is situated under the tin oxide in this silicon dioxide, the hetero junction forming there prevents a short circuit. The access to the transistors of the semiconductor device of the light sensitive semiconductor device according to the invention, takes place by columns via the diffused-in regions 7.

The application of the thin, light permeable layers 4, which preferably consist of tin oxide, by rows, and therefore the preparation of the hetero junctions can be performed in both embodiment examples according to the method, known per se, of "conducting glass surfaces." For this purpose, one evaporates for instance, tin chloride ($SnCl_2$) and conducts it, using air as the carrier gas, over the silicon substrate surface 1, which is at a temperature of approximately 400°.

The tin oxide layers 4 provided in the two examples of embodiments, do not absorb in the ultra-violet, visible and near infrared region of the spectrum. The light sensitive semiconductor devices, according to the invention, therefore, exhibit a very good "blue" sensitivity. The quantum yield is furthermore improved by the fact that the tin oxide layers 4 are made, according to the invention, as anti-reflection layers.

If the tin oxide layer 4 is doped during production, preferably with antimony, the range of the spectral sensitivity can be narrowed. With increasing antimony concentration, the long wave edge of the transparency of the tin oxide layers shifts from infrared to the visible range of the spectrum, and at an antimony content of approximately 3 to 4 percent, practically only the blue light is passed through the layers 4. In this manner, the sensitivity range of a light sensitive semiconductor device, according to the invention, can be narrowed without the use of additional filters.

The other materials specified above are equally applicable. Thus, the substrate may be any of silicon, germanium and gallium arsenide while the anti-reflection layer may be any of tin oxide, tin oxide doped with antimony, indium oxide and indium oxide doped with tin, titanium or cadmium.

What is claimed is:

1. A light sensitive semiconductor device with several light sensitive elements, separated from each other, arranged in the form of a matrix in rows and columns on a doped semiconductor substrate, wherein each light sensitive semiconductor element has a rectifying hetero junction which is formed by a thin, light transparent semiconductor layer constituting an anti-reflection layer and at least one of a first semiconductor region diffused into the semiconductor substrate and a second region diffused into the first semiconductor region; said thin, light transparent semiconductor layers extending in rows on the semiconductor substrate and electrically isolated from said substrate by an isolating layer said thin semiconductor layers contacting said second region; said first diffused-in semiconductor region extends in columns in the surface of the semiconductor substrate, said light sensitive semiconductor regions extending in rows and said diffused-in first semiconducting regions extending in columns and provided with barrier free contacts at the edges.

2. The light sensitive semiconductor device of claim 1, wherein the diffused-in first semiconductor regions exhibit the opposite conduction type from the doped semiconductor substrate.

3. The light sensitive semiconductor device of claim 1, wherein the first semiconductor regions diffused-in by columns have the opposite conduction type from the doped semiconductor substrate and that the second diffused-in regions in the first semiconductor regions form islands of the same conduction type as the doped semiconductor substrate.

4. The light sensitive semiconductor device of claim 3, wherein the isolating layer is a layer of oxide of the semiconductor substrate.

5. The light sensitive semiconductor device of claim 4, wherein the substrate is silicon, germanium or gallium arsenide.

6. The light sensitive semiconductor device of claim 4, wherein the light transparent semiconductor layer is tin oxide or indium oxide.

7. The light sensitive semiconductor device of claim 4, wherein the light transparent semiconductor layer is indium oxide doped with tin, titanium or cadmium.

8. The light sensitive semiconductor device of claim 4, wherein the light transparent semiconductor layer is tin oxide doped with antimony.

* * * * *